United States Patent [19]

Kemp et al.

[11] Patent Number: 5,442,520
[45] Date of Patent: Aug. 15, 1995

[54] APPARATUS FOR PRINTED CIRCUIT BOARD CONNECTION

[75] Inventors: James J. Kemp, Pleasant Plain; John L. DeJager, Milford; Thomas L. Allgeyer, Cincinnati; Jack E. Schenkel, Mason, all of Ohio

[73] Assignee: Cincinnnati Milacron Inc., Cincinnati, Ohio

[21] Appl. No.: 269,728

[22] Filed: Jul. 1, 1994

[51] Int. Cl.⁶ .................. H01R 23/68; H05K 7/14
[52] U.S. Cl. .................. 361/785; 361/742; 361/755; 361/752; 361/796; 439/59; 439/62
[58] Field of Search ............ 361/785–791, 361/730, 742, 736–737, 752–753, 755, 758; 439/59, 62, 65, 74, 76, 43; 361/796, 801, 804, 825

[56] References Cited

U.S. PATENT DOCUMENTS

| | | |
|---|---|---|
| 3,147,404 | 9/1964 | Sinner . |
| 3,794,954 | 2/1974 | Reimer . |
| 4,179,172 | 12/1979 | Godsey et al. . |
| 4,679,121 | 7/1987 | Schomers et al. ........ 361/785 |
| 4,862,327 | 8/1989 | Ansell et al. ........ 361/785 |
| 4,901,205 | 2/1990 | Landis et al. ........ 361/785 |
| 4,924,355 | 5/1990 | Mitchell et al. ........ 361/785 |
| 5,199,892 | 4/1993 | Campbell et al. ........ 439/246 |

FOREIGN PATENT DOCUMENTS

| | | |
|---|---|---|
| 538029 | 4/1993 | European Pat. Off. . |
| 2575336 | 12/1984 | France . |
| 3516739 | 11/1986 | Germany . |

OTHER PUBLICATIONS

Japanese Patent Abstract Gp. No. E760, Abs. vol. 13, No. 216 Abstract of Appln. No. 62-184101, filed Jul. 23, 1987; Abstract published May 19, 1989.

Primary Examiner—Bot L. Ledynh
Attorney, Agent, or Firm—John W. Gregg

[57] ABSTRACT

An apparatus for interconnection of two personal computer style processor printed circuit boards comprises a bridge printed circuit board having edge connectors on opposing edges thereof and support member for supporting the processor printed circuit boards in facing parallel arrangement with each edge connector of the bridge printed circuit board engaged in a mating socket on one of the processor boards. The support member advantageously provides pivotable support of at least one of the processor boards to permit insertion and removal of an edge connector of the bridge board into and from the mating socket of a processor board. The support member further advantageously comprises an enclosure and the pivotable support advantageously comprises a support bracket having notched end panels for engagement with pivot pins fixed to opposing surfaces of the enclosure.

6 Claims, 2 Drawing Sheets

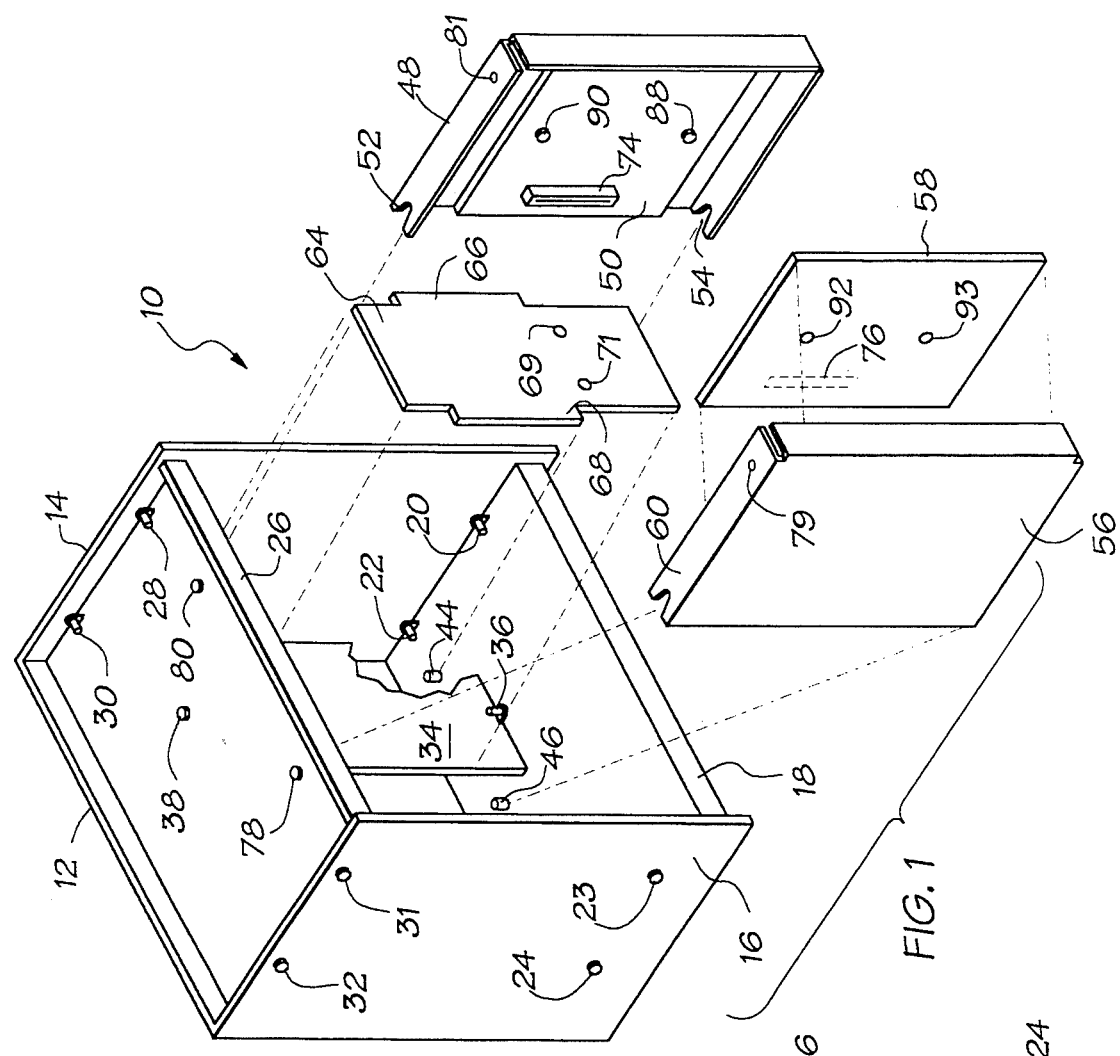
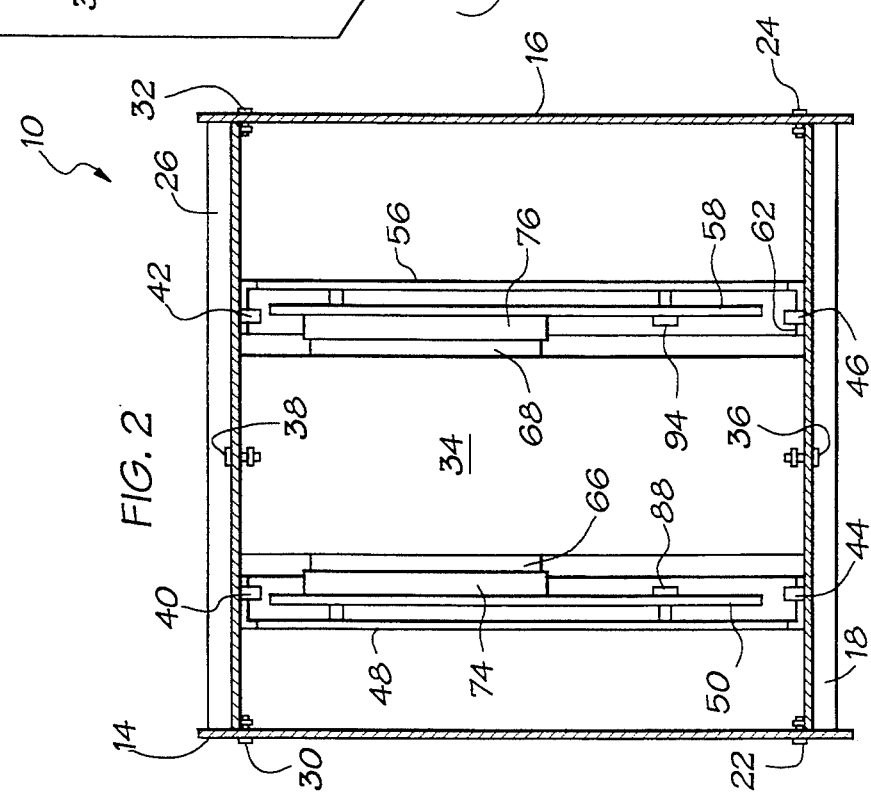

APPARATUS FOR PRINTED CIRCUIT BOARD CONNECTION

BACKGROUND OF THE INVENTION

I. Field of the Invention

This invention relates generally to interconnection of printed circuit boards and particularly to apparatus for interconnecting two personal computer style processor boards.

II. Description of Related Art

Industrial controls are known which are based upon personal computer hardware, realizing both cost savings of large scale production of such hardware and compatibility with a wide variety of compatible commercially available computer software. However, industrial controls, such as computer numerical controls place high demands on digital processing resources. In light of these demands, it is known to provide, for example, a processor dedicated to real-time control and another processor dedicated to supporting functions involving operator intervention, such as program generation and modification. Controls so arranged require means for interconnecting the processors, such as, for example, means for controlling access to a common bus for transfer of data between two processors. Such means for interconnection are absent from personal computer style "mother" boards, the printed circuit boards which comprise the central processor units of personal computers.

An aspect of the difficulty of providing interconnection of two personal computer style mother boards resides in the mechanical connection arrangement. The sole connecting means suitable for facilitating interconnection of personal computer style mother boards are sockets fitted to the mother boards for receiving edge connectors of "daughter" boards. This precludes the use of known arrangements for interconnection such as socketed backplanes and interconnecting cabling. The use of these sockets requires that the mother boards be arranged in facing parallel alignment with an interconnecting means providing edge connectors for engaging the sockets.

From European Patent Application 538 029A2 it is known to provide mating connector elements on two printed circuit boards to permit their interconnection in a space saving parallel arrangement. The printed circuit boards of this application have apertures to permit specially made connectors to be mounted so as to be recessed in the apertures to reduce the vertical distance between facing surfaces of the boards. This disclosure does not address any connecting arrangement for two commercial personal computer mother boards which are fitted with sockets for receiving edge connectors of daughter boards.

From French Patent Application 2 575 336 it is known to provide rigid supporting and connecting elements to join two printed circuit boards in a spaced parallel arrangement. The connectors of this application do not provide sliding contacts as do edge connectors and mating sockets. The disclosure of this application does not address a connecting arrangement for connecting two commercial personal computer mother boards to a third board.

SUMMARY OF THE INVENTION

It is an object of the present invention to provide for interconnection of two personal computer style mother boards using sockets present on the mother boards.

It is a further object of the present invention to provide for interconnection of two personal computer style mother boards by means of a pivotable support of at least one mother board to achieve engagement of an edge connector of a third board with a mating socket of at least one of the two mother boards.

Further objects and advantages of the present invention shall become apparent from the figures and the description thereof.

Each of two processor boards to be mounted within an enclosure and interconnected is a personal computer style mother board being fitted with a connector socket. A bridge board has edge connectors for mating engagement with the connector sockets of the two processor boards. At least one processor is mounted to a processor bracket providing pivoting support. With the bridge board in place, installation of a processor board is accomplished by pivoting the support bracket to insert the edge connector of the bridge board into the mating socket of a processor board. Removal of a processor board is accomplished in the reverse order of installation, swinging the processor bracket to free the edge connector of the bridge board from the socket and removal of the processor board from the enclosure.

BRIEF DESCRIPTION OF THE DRAWINGS

FIG. 1 is an exploded view of an enclosure in accordance with the present invention.

FIG. 2 is a rear view of the interior of the enclosure of FIG. 1 with two printed circuit boards connected to a third board.

DETAILED DESCRIPTION OF THE PREFERRED EMBODIMENT

Figure 3:
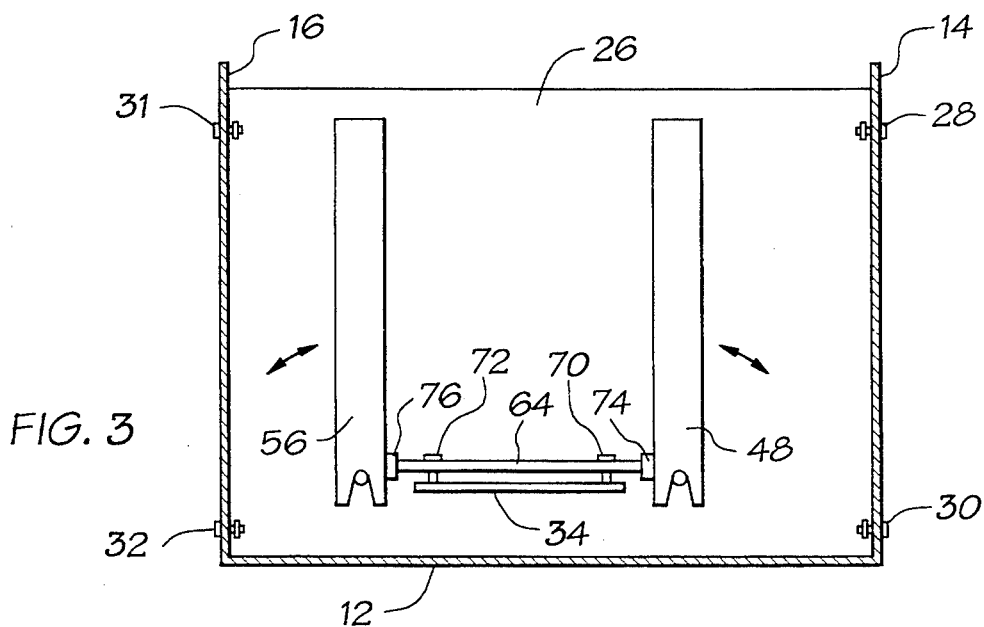
FIG. 3 is a bottom view of the interior of the enclosure of FIG. 1 illustrating the pivoting of processor brackets.

To illustrate the invention, a computer numerical control (CNC) processor enclosure developed by the assignee of the present invention shall be described in detail. One advantageous arrangement for interconnection of two personal computer style mother boards is illustrated by this CNC enclosure. Other arrangements are recognized as being within the spirit and scope of the present invention.

Referring to FIGS. 1 and 2 an enclosure 10 has a back 12 and side panels 14 and 16, preferably formed from a single metal sheet. A bottom plate 18 is held in place by fasteners 20, 22, 23 and 24, preferably self-threading screws, through sides 14 and 16. A top plate 26 is held in place by fasteners 28, 30, 31 and 32, preferably self-threading screws, through side panels 14 and 16. A support plate 34 extends between bottom plate 18 and top plate 26 and is held in place by fasteners 36 and 38 through the bottom and top plates respectively. Top plate 26 is fitted with pivot pins 40 and 42 (FIG. 2) projecting into the interior of enclosure 10. Bottom plate 18 is fitted with pivot pins 44 and 46 opposing pins 40 and 42 respectively and projecting into the interior of enclosure 10.

Continuing with reference to FIGS. 1 and 2, a first processor bracket 48 has upper and lower notched end panels 52 and 54. A first processor printed circuit board 50 is mounted to mounting standoffs on processor bracket 48 by fasteners 88 and 90 passing through holes in board 50. A second processor bracket 56 has upper and lower notched end panels 60 and 62 and a second processor printed circuit board 58 is mounted thereto. Fasteners for mounting processor board 58 (fastener 94 appears in FIG. 2) to bracket 56 pass through mounting holes such as holes 92 and 93 shown in FIG. 1. Preferably each of processor brackets 48 and 56 is formed from a single metal sheet for efficient fabrication.

A bridge board 64, provides connection to both first and second processors via first edge connector 66 and second edge connector 68. Bridge board 64 is advantageously equipped with logical interface elements to provide the required signal interfacing to permit signal exchange between the processor boards 50 and 58. Preferably, bridge board 64 is fitted with sockets (not shown) to receive other printed circuit board edge connectors. Bridge board 64 is secured to support plate 34 by fasteners 70 and 72 (FIG. 3) through mounting holes 69 and 71. Processor printed circuit board 50 is fitted with a socket 74 for mating connection with edge connector 66. Processor printed circuit board 58 is fitted with a socket 76 for mating connection with edge connector 68.

Figure 5:
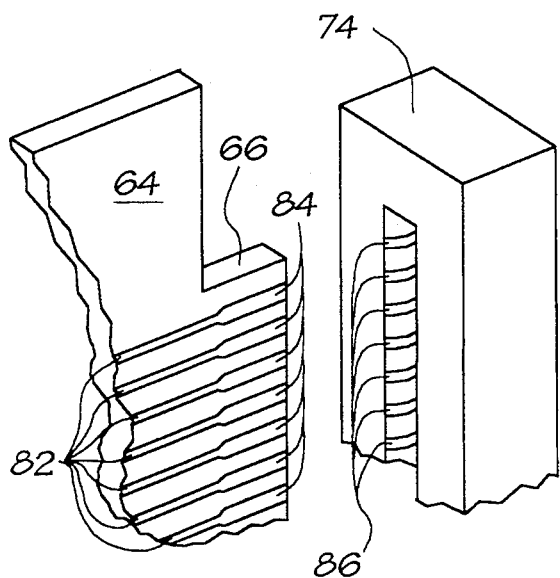
FIG. 5 is a detail of an edge connector and mating socket.

The arrangement of bridge board 64 and processor boards 50 and 58 provides interconnection of two personal computer type mother boards and ease of installation and removal of the mother boards from an enclosure. The edge connectors 66 and 68 of bridge board 64 are conventional, i.e. plated or printed conductors 82 on either or both surfaces of the board are routed to a projecting edge of the board. Within the area of the edge projection the conductors are configured as pads 84 having areas and spacing for cooperation with connectors of commercially available mating sockets (FIG. 5). The mating sockets are typically fitted with resilient contacts 86 which wipe the edge connector conductor pads on insertion and removal of the edge connector from the socket. To insure good electrical conductivity through the resilient contacts and the pads of the edge connector, the bridge board must be maintained substantially perpendicular to the mother boards. Brackets 48 and 56 support mother boards 50 and 58 parallel to one another and substantially perpendicular to bridge board 64.

Figure 4:
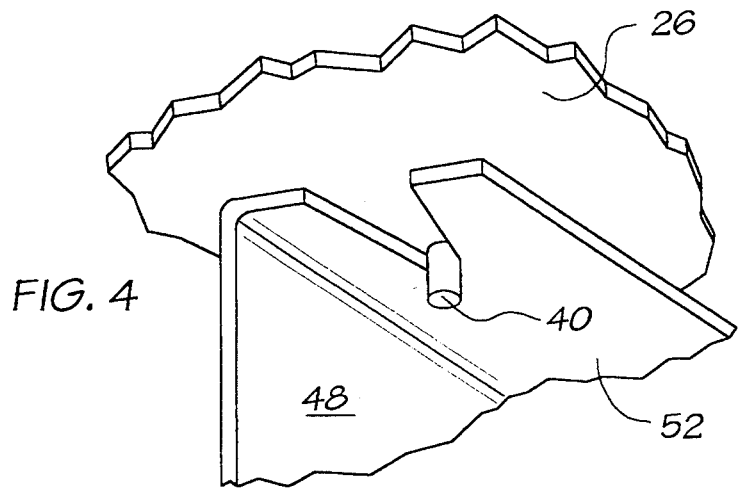
FIG. 4 illustrates engagement of a notched end plate of a processor bracket with a pivot pin.

With brackets 48 anti 56 removed, bridge board 64 is readily mounted or removed from support plate 34. With bridge board 64 in place on support plate 34, each of brackets 48 and 56 are installed in enclosure 10 by inserting the bracket toward enclosure back 12 while maintaining clearance of the processor board from the edge connector of bridge board 64. The bracket is inserted to engage the notches of the upper and lower notched end panels with the opposing pivot pins of top and bottom plates 26 and 18 (FIGS. 2 and 4). The bracket is then pivoted on the pins (FIG. 3) to achieve insertion of the edge connector of bridge board 64 into the mating socket of the processor printed circuit board. Bracket 48 is secured to top plate 26 with a single fastener, e.g. thumb screw 78, engaging threaded hole 79. Bracket 56 is secured to top plate 26 with a single fastener, e.g. thumb screw 80 engaging threaded hole 81. Cables to be connected to a processor printed circuit board are then attached.

Removal of each processor bracket is accomplished in the reverse order of installation. With all cables disconnected from the processor board, the fastener securing the bracket to top plate 26 is disengaged from the bracket. Then the processor bracket is swung on the opposing pivot pins (FIGS. 2 and 3) to disengage the edge connector of bridge board 64 from the mating socket of the processor board. The bracket is pulled away from the back of enclosure 10 to disengage the notches of the upper and lower plates from the opposing pivot pins of top and bottom plates 26 and 18. The bracket is then extracted from enclosure 10.

While the preferred embodiment has been described in considerable detail, it will be appreciated that alternative arrangements may serve equally well for interconnection of two processors comprising personal computer style mother boards. It is contemplated that pivotable support of at least one of two personal computer style mother boards be provided to facilitate connection of two mother boards to a third board. It being necessary only that the three boards and sufficient supporting means are arranged so that insertion and removal of an edge connector of the third board into and from a socket of one of the mother boards is achieved by pivoting of one of the mother boards. The arrangement of the preferred embodiment illustrates an assembly of a processor board and removable support bracket being pivotably supportable within an enclosure. Alternatively a processor may be removably mounted to a pivotable panel of an enclosure. Nor is it necessary that the pivoting means be limited to the details of the preferred embodiment, it being required only that suitable means be provided to permit pivoting of a support for at least one of two processor boards and that the support, the pivoting means, the processor boards and the third board be arranged to provide engagement and disengagement of an edge connector of the third board with a mating socket of a processor board by pivoting of one of the processor boards. Further, while the preferred embodiment illustrates an independent mounting for a bridge board to which two processors are to be connected, it is recognized that an interconnecting bridge board may be suitably supported during installation and removal by engagement of one edge connector with a socket of one of the two processor boards. The bridge board would ultimately be entirely supported by engagement of the its opposing edge connectors in the mating sockets of the two processors. In such an arrangement, the bridge board could be installed in the mating socket of either a pivotably supported mother board or the fixedly supported mother board in preparation for connection with the other of the two mother boards. Further, while the preferred embodiment illustrates an arrangement to support two mother boards vertically within an enclosure between a top and bottom plate, the enclosure might advantageously provide for horizontal mounting of the mother boards. It is the intention of applicants that the invention not be limited to the details of the preferred embodiments but that the invention be defined by the spirit and scope of the appended claims and all equivalents thereto.

What is claimed is:

1. An apparatus for providing interconnections of two personal computer style printed circuit mother boards, the interconnection to each mother board being made through a connecting socket thereon, the apparatus comprising:

a. a bridge printed circuit board having two edge connectors for mating engagement with the sockets of the mother boards, the edge connectors being disposed on opposing edges of the bridge printed circuit board;

b. support means for supporting the mother boards parallel to each other and substantially perpendicular to the bridge printed circuit board so that an edge connector of the bridge printed circuit board is inserted into the mating socket of each mother board, the support means including a pivotable support for at least one mother board, the mother board and its pivotable support being arranged so that an edge connector of the bridge printed circuit board is inserted into and removed from the mating socket of one of the mother boards by pivoting of the pivotably supported mother board.

2. The apparatus of claim 1 further comprising mounting means for the bridge printed circuit board.

3. The apparatus of claim 2 wherein the support means further comprises an enclosure, a first support bracket for supporting a first mother board within the enclosure and a second support bracket for supporting a second mother board within the enclosure, at least one of the first and second support brackets being pivotable within the enclosure such that with the bridge printed circuit board mounted to the mounting means an edge connector of the bridge printed circuit board is inserted into and removed from the mating socket of the pivotably supported mother board by pivoting the support bracket.

4. The apparatus of claim 1 wherein the support means further comprises:

a. an enclosure;

b. mounting means within the enclosure for the bridge printed circuit board;

c. a first support bracket for supporting a first mother board within the enclosure such that with the bridge printed circuit board mounted to the mounting means one edge connector thereof is inserted into the mating socket of the first mother board; and d. a second support bracket for supporting a second mother board within the enclosure such that with the bridge printed circuit board mounted to the mounting means the second edge connector thereof is inserted into the mating socket of the second mother board.

5. The apparatus of claim 4 wherein the enclosure includes a top and bottom fitted with two pairs of opposing pivot pins and the first and second support brackets have notched upper and lower end panels for pivotal engagement with the pivot pins, the pivot pins being arranged relative the bridge printed circuit board mounting means such that an edge connector of the bridge printed circuit board is inserted into or removed from the mating socket of a mother board by pivoting the support bracket on the pivot pins.

6. An apparatus comprising:

a. an enclosure having a top plate and a bottom plate, the top and bottom plates being fitted with two pairs of opposed pivot pins;

b. first and second mounting brackets having notched projections at the top and bottom thereof, each mounting bracket being insertable between the top and bottom plates of the enclosure for pivotable engagement with a pair of the opposed pivot pins;

c. a first personal computer style mother board having a first connector socket and being mounted to the first mounting bracket;

d. a second personal computer style mother board having a second connector socket and being mounted to the second mounting bracket;

e. a bridge circuit board having opposing first and second edge connectors, the first edge connector insertable into the first connector socket and the second edge connector insertable into the second connector socket;

f. a bridge bracket supporting the bridge circuit board so that the first mounting bracket may be pivoted on one pair of opposed pivot pins to insert the first edge connector into the first connector socket and the second mounting bracket may be pivoted on the other pair of pivot pins to insert the second edge connector into the second connector socket and so that with the edge connectors inserted in the mating sockets the bridge circuit board is substantially perpendicular to both of the mother boards.

* * * * *